(12) United States Patent
Simoni et al.

(10) Patent No.: US 9,134,337 B2
(45) Date of Patent: Sep. 15, 2015

(54) MICROELECTROMECHANICAL Z-AXIS OUT-OF-PLANE STOPPER

(71) Applicant: Maxim Integrated Products, Inc., San Jose, CA (US)

(72) Inventors: Barbara Simoni, Bareggio (IT); Luca Coronato, Corsico (IT); Gabriele Cazzaniga, Rosate (IT)

(73) Assignee: Maxim Integrated Products, Inc., San Jose, CA (US)

( * ) Notice: Subject to any disclaimer, the term of this patent is extended or adjusted under 35 U.S.C. 154(b) by 345 days.

(21) Appl. No.: 13/716,950

(22) Filed: Dec. 17, 2012

(65) Prior Publication Data

US 2014/0298910 A1    Oct. 9, 2014

(51) Int. Cl.
*G01P 15/125* (2006.01)
*G01P 1/00* (2006.01)
*B81B 3/00* (2006.01)
*G01P 15/08* (2006.01)

(52) U.S. Cl.
CPC . *G01P 1/00* (2013.01); *B81B 3/001* (2013.01); *G01P 15/125* (2013.01); *B81B 2201/0235* (2013.01); *B81C 2203/0118* (2013.01); *G01P 2015/0871* (2013.01); *Y10T 29/49002* (2015.01)

(58) Field of Classification Search
CPC ... G01P 15/125; G01P 15/0802; G01P 15/18; G01P 15/131; G01P 15/123; G01P 15/08; G01P 1/023; G01P 1/003
USPC .............. 73/514.32, 514.36, 514.38, 514.18, 73/514.17
See application file for complete search history.

(56) References Cited

U.S. PATENT DOCUMENTS

| | | | | |
|---|---|---|---|---|
| 4,930,043 A * | 5/1990 | Wiegand | | 73/514.18 |
| 5,367,429 A * | 11/1994 | Tsuchitani et al. | | 361/280 |
| 6,153,917 A * | 11/2000 | Matsunaga et al. | | 257/419 |
| 6,230,564 B1 * | 5/2001 | Matsunaga et al. | | 73/514.01 |
| 6,841,992 B2 * | 1/2005 | Yue et al. | | 324/162 |
| 6,871,544 B1 * | 3/2005 | Selvakumar et al. | | 73/514.18 |
| 7,111,513 B2 * | 9/2006 | Sugiura | | 73/514.32 |
| 7,121,141 B2 * | 10/2006 | McNeil | | 73/514.32 |
| 7,578,190 B2 * | 8/2009 | Lin et al. | | 73/514.29 |
| 7,610,809 B2 * | 11/2009 | McNeil et al. | | 73/514.32 |
| 8,146,425 B2 * | 4/2012 | Zhang et al. | | 73/514.32 |
| 8,312,770 B2 * | 11/2012 | Fukaura | | 73/514.32 |
| 8,627,719 B2 * | 1/2014 | Offenberg et al. | | 73/514.32 |

* cited by examiner

*Primary Examiner* — Helen Kwok
(74) *Attorney, Agent, or Firm* — North Weber & Baugh LLP

(57) ABSTRACT

The present invention relates to a microelectromechanical structure, and more particularly, to systems, devices and methods of incorporating z-axis out-of-plane stoppers that are controlled to protect the structure from both mechanical shock and electrostatic disturbance. The z-axis out-of plane stoppers include shock stoppers and balance stoppers. The shock stoppers are arranged on a cap substrate that is used to package the structure. These shock stoppers are further aligned to a proof mass in the structure to reduce the impact of the mechanical shock. The balance stoppers are placed underneath the proof mass, and electrically coupled to a balance voltage, such that electrostatic force and torque imposed by the shock stoppers is balanced by that force and torque generated by the balance stoppers. This structure is less susceptible to mechanical shock, and shows a negligible offset that may be induced by electrostatic disturbance caused by the shock stoppers.

20 Claims, 5 Drawing Sheets

100

150

MICROELECTROMECHANICAL Z-AXIS OUT-OF-PLANE STOPPER

BACKGROUND

A. Technical Field

The present invention relates to a microelectromechanical structure, and more particularly, to systems, devices and methods of incorporating z-axis out-of-plane stoppers that are controlled to protect the structure from mechanical shock with negligible electrostatic disturbance. This microelectromechanical structure is less susceptible to mechanical shock, and shows a negligible offset that may be induced by an electrostatic force imposed by a shock stopper.

B. Background of the Invention

A microelectromechanical structure (MEMS) is widely applied as a sensor to measure acceleration, rotation, pressure and many other physical parameters. The MEMS device is normally formed on a silicon substrate using a micromachining process, and thus, adopts characteristic feature sizes of several micrometers. Such miniaturized devices transduce mechanical movement to electrical signals that may indicate the level of the interested parameter. One typical MEMS device is a micro-machined capacitive accelerometer that comprises a proof mass. The proof mass is suspended above the silicon substrate, and anchored via elastic elements that are configured to offer desirable mechanical displacement or vibration. Various MEMS devices have been widely employed in applications ranging from consumer products to specialized products used under extreme environments, and nowadays, they may be easily found in automotive parts, mobile phones, gaming devices, medical appliance, and military applications.

Any MEMS device has to maintain an acceptable level of shock robustness in order for successful commercialization. The MEMS device is basically reliant on the mechanical response of its microstructure, and such structure is inevitably susceptible to mechanical vibration and shock coupled from the surrounding environments. However, shock is one main environmental influence that could potentially degrade device performance and cause permanent structural damage. If the MEMS device does not have sufficient immunity against the shock that may be experienced in its application, reliability is easily compromised, and failure could be expected to arise sooner or later.

Shock takes a form of an impulse-like mechanical load that develops from a large force within a short duration. According to its source, the magnitude of the shock may vary dramatically, ranging from 1 g in a free-fall hit to the ground to 10,000 g or larger under some extreme conditions. A higher shock level requires the MEMS device to incorporate more sophisticated anti-shock techniques, and normally induces a higher manufacturing cost. It is a waste to design the MEMS device to be excessively robust, when its application does not impose so. In general, the MEMS device has to be engineered according to the particular application that it is intended for, such that it may provide a reasonable level of shock robustness at a reasonable cost.

In some prior arts, the elastic elements are engineered to increase robustness of the MEMS device such that it may sustain a large shock load. A special medium may also be used to fill the package that encloses the MEMS device, and the shock load is significantly dampened prior to reaching the device. However, these techniques impact the structure directly, and compromises device performance under normal operational conditions as well. A need exists to protect the MEMS device from the shock while maintaining its normal device performance.

SUMMARY OF THE INVENTION

Various embodiments of the present invention relate to a microelectromechanical structure, and more particularly, to systems, devices and methods of incorporating z-axis out-of-plane stoppers that are controlled to protect the structure from mechanical shock with negligible electrostatic disturbance. This microelectromechanical structure is less susceptible to mechanical shock, and shows a negligible offset that may be induced to its output by an electrostatic force imposed by a shock stopper.

One aspect of the invention is a microelectromechanical structure that comprises a sensor substrate, a proof mass, a cap substrate and a plurality of balance stoppers. The proof mass is suspended above the sensor substrate via at least one elastic element. The mass displaces and tilts in response to acceleration of the structure. The cap substrate is bonded to the sensor substrate to form a cavity that encloses the proof mass. The cap substrate further comprises a plurality of shock stoppers that are arranged above the proof mass to push back the proof mass at specific locations upon a shock load. Each of the plurality of balance stoppers is coupled underneath the proof mass, arranged according to a position of at least one of the plurality of shock stoppers, and driven electrically by a balance voltage. As a result, the plurality of balance stoppers may generate electrostatic force and torque on the proof mass to balance the force and torque generated by the plurality of shock stoppers.

One aspect of the invention is a method of protecting a microelectromechanical structure from mechanical shock with negligible electrostatic disturbance. A plurality of shock stoppers is integrated on a cap substrate that is bonded to a sensor substrate and forms a cavity to enclose a proof mass. A plurality of balance stoppers is incorporated underneath the proof mass. Each balance stopper is placed according to a position of at least one of the plurality of shock stoppers, and the balance stopper is subsequently electrically coupled to a balance voltage. As a result, the plurality of balance stoppers may generate electrostatic force and torque on the proof mass to balance force and torque generated by the plurality of shock stoppers.

Certain features and advantages of the present invention have been generally described in this summary section; however, additional features, advantages, and embodiments are presented herein or will be apparent to one of ordinary skill in the art in view of the drawings, specification, and claims hereof. Accordingly, it should be understood that the scope of the invention shall not be limited by the particular embodiments disclosed in this summary section.

BRIEF DESCRIPTION OF THE DRAWINGS

Reference will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

FIGURE (hereinafter, "FIG.") 1A illustrates an exemplary cross section of an out-of-plane accelerometer according to various embodiments in the invention.

DETAILED DESCRIPTION OF THE PREFERRED EMBODIMENTS

Figure 1A:
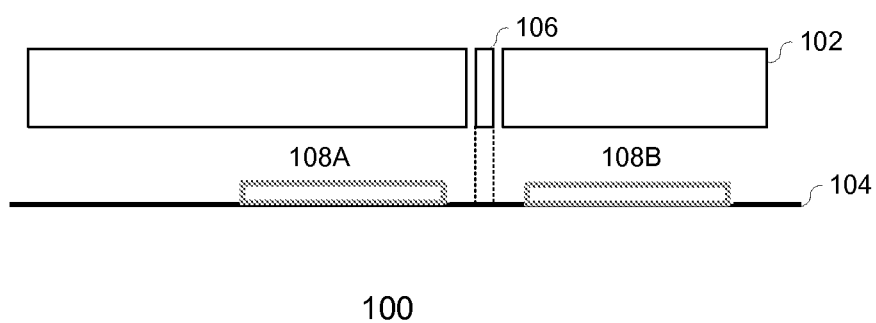
FIG. 1B illustrates its response to an out-of-plane acceleration according to various embodiments in the invention.

In the following description, for the purpose of explanation, specific details are set forth in order to provide an understanding of the invention. It will be apparent, however, to one skilled in the art that the invention can be practiced without these details. One skilled in the art will recognize that embodiments of the present invention, described below, may be performed in a variety of ways and using a variety of means. Those skilled in the art will also recognize additional modifications, applications, and embodiments are within the scope thereof, as are additional fields in which the invention may provide utility. Accordingly, the embodiments described below are illustrative of specific embodiments of the invention and are meant to avoid obscuring the invention.

Reference in the specification to "one embodiment" or "an embodiment" means that a particular feature, structure, characteristic, or function described in connection with the embodiment is included in at least one embodiment of the invention. The appearance of the phrase "in one embodiment," "in an embodiment," or the like in various places in the specification are not necessarily all referring to the same embodiment.

Furthermore, connections between components or between method steps in the figures are not restricted to connections that are effected directly. Instead, connections illustrated in the figures between components or method steps may be modified or otherwise changed through the addition thereto of intermediary components or method steps, without departing from the teachings of the present invention.

In this invention, various embodiments of the present invention relate to a microelectromechanical structure (MEMS), and more particularly, to systems, devices and methods that incorporate z-axis out-of-plane stoppers to dampen mechanical shock from the ambient in an electrostatically balanced manner. The z-axis out-of-plane stoppers include shock stoppers and balance stoppers. The shock stoppers are arranged on a cap substrate, and positioned above the MEMS device inside a MEMS package. When a large shock load hits the MEMS, a proof mass does not collapse to contact the cap substrate over a large area, but is controlled to contact at the shock stoppers. Although it is effective to protect the MEMS device from a shock, the cap substrate and the shock stoppers are maintained at a different voltage level from that of the MEMS device. Electrostatic force and torque are generated on the proof mass, and disturb the device's mechanical response to acceleration. To counteract such electrostatic impact, additional balance stoppers are monolithically arranged underneath the proof mass on the device substrate, and their precise positions are determined according to the positions of the corresponding shock stoppers. A balance voltage bias is applied to each of the balance stoppers to neutralize the electrostatic force and torque generated by a corresponding shock stopper.

Such mechanical balance is particularly important, because this force causes a displacement offset to the MEMS device. This displacement offset further leads to an offset in the output and an error in sensed acceleration that is indicated by the output. Other device performance, e.g., sensitivity and full scale range of the structure, may also be fundamentally compromised as a result of the unwanted electrostatic disturbance. Application of both the shock and balance stoppers may allow this MEMS device to become less susceptible to mechanical shock, while only having a negligible offset that may be induced to its output.

In various embodiments of the invention, a z-axis out-of-plan accelerometer is used as one particular embodiment to illustrate the systems, devices and methods that incorporate shock stoppers and balance stoppers to dampen mechanical shock in an electrostatically balanced manner. One of those skilled in the art knows that such a technique is applicable to any MEMS device packaged in a cavity as far as the shock and balance stoppers may be arranged properly on the cavity cap and the sensor substrate, respectively.

Figure 1B:
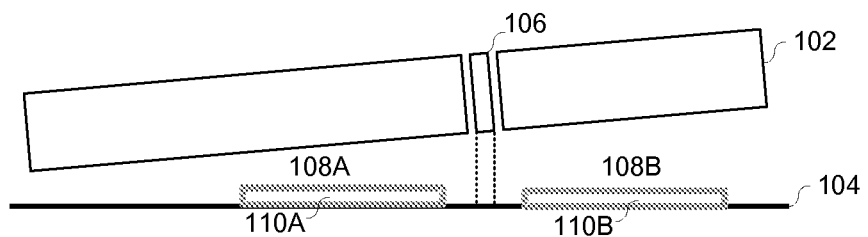

FIG. 1A illustrates an exemplary cross section of an out-of-plane accelerometer 100 according to various embodiments in the invention, and FIG. 1B illustrates its response 150 to an out-of-plane acceleration according to various embodiments in the invention. The accelerometer 100 comprises a moveable proof mass 102 which is anchored to a sensor substrate 104 by means of elastic elements 106. Electrodes are formed on both the proof mass 102 and the stationary sensor substrate 104. In this embodiment, two capacitors 108A and 108B are respectively formed on two sides of the elastic elements 106.

In response to acceleration, the proof mass 102 displaces along the z-axis and tilts with respect to its rotation axis that is associated with the elastic elements 106. The gaps vary between the proof mass 102 and corresponding sensor electrodes, 110A and 110B. The gap variations lead to capacitance variations to capacitors 108A and 108B and potentially a mismatch between them. Such capacitance variations and/or mismatch are subsequently processed by an interface circuit, and an output of the interface circuit indicates the magnitude of the acceleration.

Figure 2:
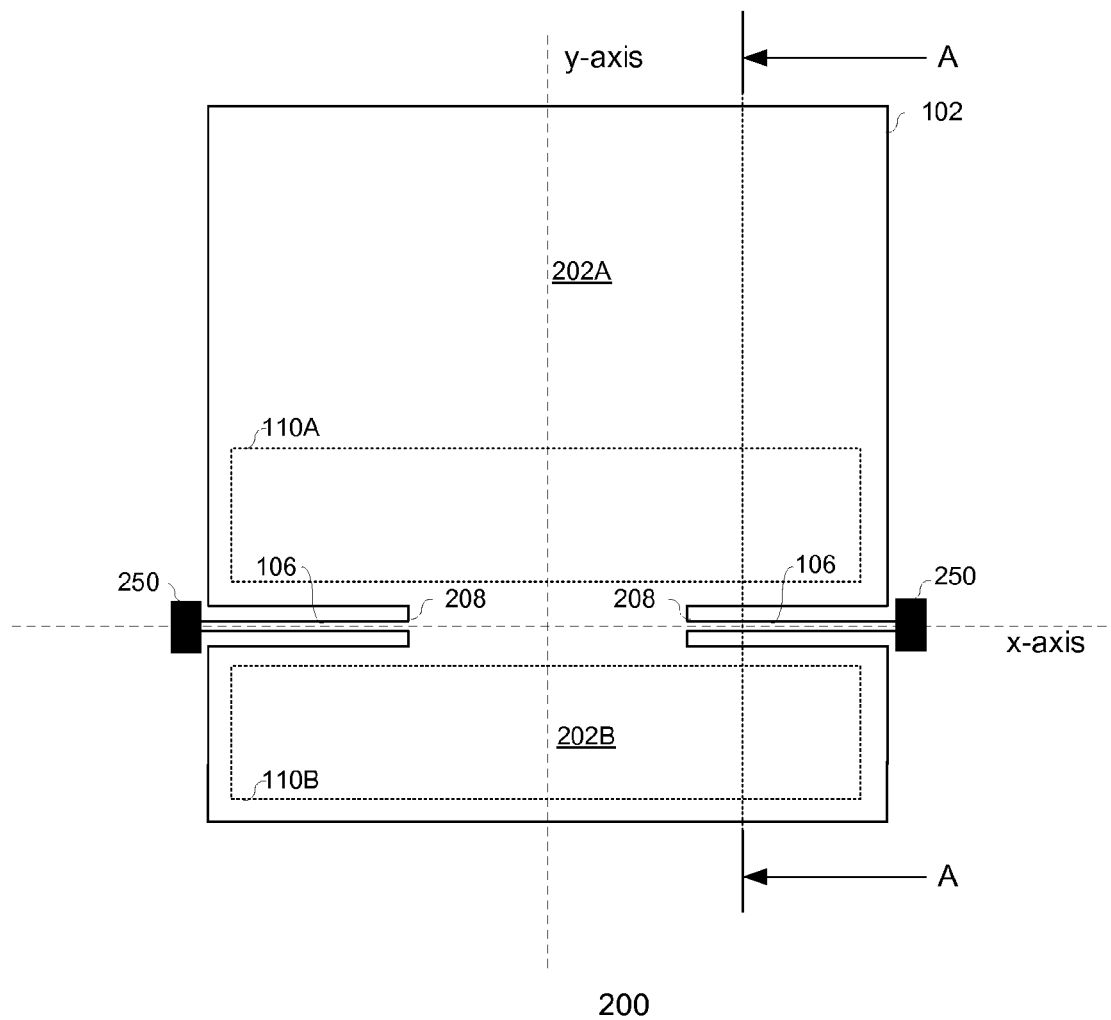
FIG. 2 illustrates an exemplary top view of an out-of-plane accelerometer according to various embodiments in the invention.

FIG. 2 illustrates an exemplary top view 200 of an out-of-plane accelerometer 100 according to various embodiments in the invention. Cross section A is reflected in FIGS. 1A and 1B. The moveable proof mass 102 is coupled to the substrate 150 at anchors 250. In various embodiments of the invention, a single elastic element or more than one element may be adopted, and dimensions and configurations of the elastic elements 106 may be adjusted as well in order to provide a desirable mechanical response to the acceleration.

In this embodiment, the accelerometer 200 is symmetric with respect to a y-axis that is parallel to the proof mass 102 and passes its center. The proof mass 102 is divided into two panels 202A and 202B at its coupling points 208 where the elastic elements 106 are coupled. An x-axis connects the coupling points 208 on the proof mass 102, and constitutes a moveable mass rotational axis with respect to which the proof mass 102 may tilt.

Two separate sensor electrodes 110A and 110B are formed on the substrate, and coupled underneath panels 202A and 202B, respectively. In various embodiments of the invention, panels 202A and 202B may have identical or different sizes according to the requirements of the accelerometer 200. Likewise, sensor electrodes 110A and 110B may also adopt identical or different sizes that are not necessarily equal to those of panels 202A and 202B. Two separate capacitors 108A and 108B are respectively formed between sensor electrode 110A and panel 202A, and between sensor electrode 110B and panel 202B. In one embodiment, sensor electrodes 110A and 110B are of the same size, so regardless of their panel sizes, these two capacitors have matched capacitance values if their capacitor gaps are equal.

In some embodiments, one capacitor, rather than two, is formed between sensor electrodes on the sensor substrate 104 and the proof mass 102. The capacitance variation is monitored by a readout circuit to indicate the acceleration experienced by the accelerometer 100.

Figure 3:
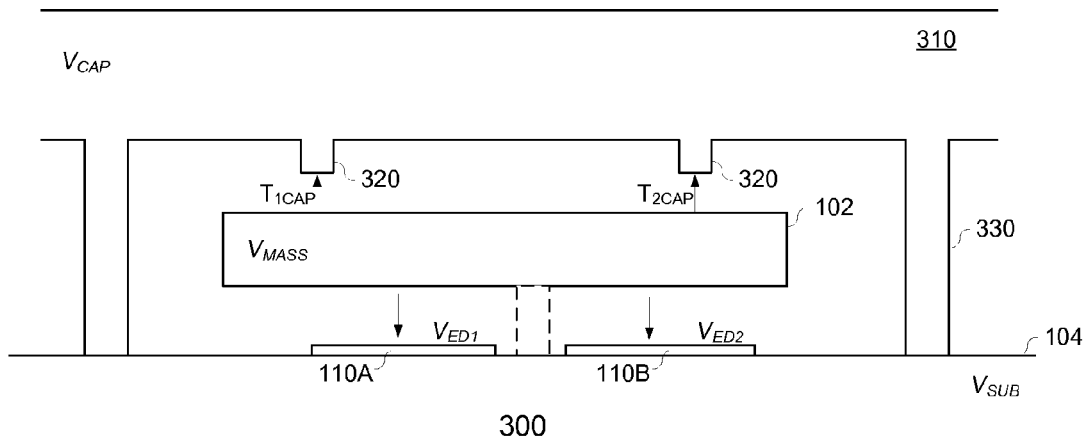
FIG. 3 illustrates an exemplary cross section of an out-of-plane accelerometer that is assembled in a MEMS package according to various embodiments in the invention.

FIG. 3 illustrates an exemplary cross section of an out-of-plane accelerometer 300 that is assembled in a MEMS package according to various embodiments in the invention. The accelerometer 300 is enclosed inside the MEMS package by bonding another cap substrate 310 to the sensor substrate 104. Edge 330 is fully sealed between the cap and sensor substrates, while interconnect leads are still allowed to be transferred through.

The cap substrate 310 further comprises a plurality of shock stoppers 320. Upon a large shock load, the proof mass 102 may display a large displacement and hit the cap substrate 320 over a large area. Large contact area may lead to stiction between the proof mass 102 and the cap substrate 320, and ultimately the proof mass 102 could collapse to the cap substrate 310. The shock stoppers 320 are arranged at certain locations above the proof mass 102. A counter-force is generated to push back the mass 102 at these particular locations, and effectively balance against the impact of the shock load while reducing the risk for stiction. In this embodiment, a respective stopper is arranged close to an outer edge of panels 202A and 202B, such that a large torque is generated to control the response of the proof mass 102 to mechanical shock.

In one embodiment, the out-of-plane accelerometer 100 is manufactured from a surface micromachining process. The sensor substrate 104 is made of silicon, and a layer of conducting film is deposited on the sensor substrate 104. This layer of film is polysilicon or metal, and both sensor electrodes 110A and 110B are formed on this layer of film. A sacrificial layer is subsequently deposited to cover sensor electrodes 110A and 110B, and openings are etched out on the sacrificial layer to reserve locations for anchors 250. These openings are filled when an additional layer of mass material is deposited on the top of the sacrificial layer. The proof mass 102, the elastic elements 106, and the anchors 250 are subsequently patterned out of the layer of mass material. The surface micromachining process ends with final steps of removing the sacrificial layer and releasing the accelerometer 200. The proof mass 102 is suspended over and anchored to the substrate 106 via the elastic elements 106 and anchors 250.

In certain embodiments, additional layers of mass materials may be deposited on panels 202A and 202B, and the proof mass 102 may have a different thickness from that of the elastic elements. These additional layers of mass materials do not have to remain the same material used for the elastic elements.

This accelerometer 200 has to be electrically coupled, safely packaged, and assembled into a sensing system. The accelerometer 200 is protected in the MEMS package as in FIG. 3. The cap substrate 310 is separately manufactured, and used to form the MEMS package through a wafer bonding process.

Figure 4:
FIG. 4 illustrates an exemplary diagram of a cap substrate according to various embodiments of the invention.

FIG. 4 illustrates an exemplary diagram of a cap substrate 310 according to various embodiments of the invention. The cap substrate 310 may be made of a silicon or glass wafer. The edge 330 and shock stoppers 320 adopt distinct heights, and have to be arranged at specific locations that are aligned to the proof mass 102. When the MEMS package is sealed, the cap and sensor substrates 310 and 104 are fused along the edge 330 to form a cavity. The proof mass 102 is enclosed in the cavity, and the shock stoppers 320 lie above the proof mass.

In one embodiment, the edge 330 and shock stoppers 320 are formed by recessing the cap substrate 310. In another embodiment, extrinsic edge and shock stopper parts are assembled on the cap substrate 310. The latter solution imposes a challenge on hybrid packaging because the edge and stopper parts have to be individually and precisely placed on specific locations. In contrast, the former allows monolithic manufacturing based on high precision lithographic patterning.

In various embodiments of the invention, the cap substrate 310 and the sensor substrate 106 are sealed at the edge 330 by metal-to-metal or silicon-to-metal bonding process. Both sensor electrodes 110A-110B and the proof mass 102 are electrically coupled out of the MEMS package. In certain embodiments, the accelerometer 100 is a device integrated with a readout circuit formed on the same substrate 106. In one embodiment, the read out circuit is arranged underneath the proof mass 106 or closely next to the proof mass 106. Thus, the circuit has to be enclosed under the cap substrate 310. In another embodiment, the read out circuit is located remotely on the substrate 106, and sensor electrodes of the accelerometer 100 are electrically coupled out of the MEMS package to connect to the circuit.

Although the shock stoppers 320 effectively improve device robustness against mechanical shock, they may also introduce unwanted electrostatic disturbance to the proof mass 102. In FIG. 3, the cap substrate 310, the proof mass 102, the sensor substrate 106 and the sensor electrodes 110A and 110B adopt a voltage level of $V_{CAP}$, $V_{MASS}$, $V_{SUB}$, $V_{ED1}$ and $V_{ED2}$, respectively. The bias difference between the voltage levels of $V_{CAP}$ and $V_{MASS}$ leads to electrostatic attraction between the cap substrate 310 and the proof mass 102. In particular, net torque $T_{1CAP}$ and $T_{2CAP}$ may arise at locations associated with the shock stoppers 320, due to their proximity to the proof mass 102. Such net force and torque created by the cap substrate 310 will undesirably offset the displacement and tilting angle of the proof mass 102, ultimately compromising device performances including sensitivity, offset and full-scale range.

In the prior art, the net torque between $T_{1CAP}$ and $T_{2CAP}$ are maintained at zero, such that the force and torque balance for the proof mass 102 is not disturbed due to incorporation of the shock stoppers 320. To maintain the net torque, the shock stoppers 320 have to adopt symmetric placement and shape with respect to the anchor In various embodiments of the present invention, at least one balance stopper is arranged on the sensor substrate 104 to compensate the electrostatic force and torque generated by each of the shock stopper 320. As a result, each of the shock stoppers 320 may be independently placed at a desirable location to control the impact of mechanical shock, and the electrostatic disturbance is no longer a concern because it may be effectively compensated by the corresponding balance stoppers.

Figure 5:
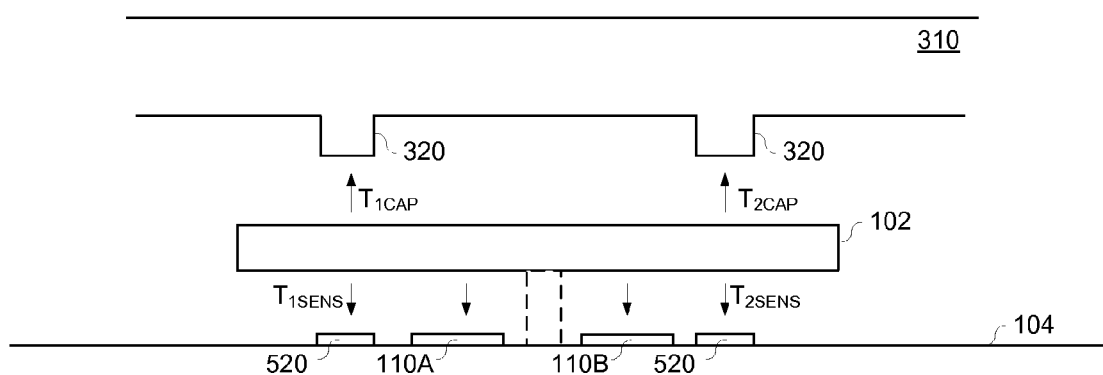
FIG. 5 illustrates an exemplary cross section of an out-of-plane accelerometer that incorporates balance stoppers according to various embodiments in the invention.

FIG. 5 illustrates an exemplary cross section 500 of an out-of-plane accelerometer that incorporates balance stoppers according to various embodiments in the invention. The balance stoppers 520 are arranged underneath the proof mass 102, and positioned according to the locations of the shock stoppers 320. In one embodiment, the balance stoppers 520 are fixed on the sensor substrate 104. They take a form of electrodes like sensor electrodes 110A and 110B, and are made from the same layer of conducting film. In another embodiment, the balance stoppers 520 are realized directly using the sensor substrate 104.

Each of the balance stoppers 520 is electrically coupled to a balance voltage, $V_{BL}$, and generates a torque, $T_{1SENS}$ or $T_{2SENS}$, to balance the respective electrostatic torque, $T_{1CAP}$ or $T_{2CAP}$, generated primarily by the shock stopper 320. In this embodiment, a net torque between $T_{1CAP}$ and $T_{1SENS}$ is zero, and so is a net torque between $T_{1CAP}$ and $T_{1SENS}$. Since each portion of the moveable proof mass is separately balanced, the overall balance is easily maintained even if the torque associated with the shock stoppers 320 is difficult to balance by itself. In one embodiment, the balance stoppers 520 are driven at different balance voltage levels, $V_{BL1}$ and $V_{BL2}$, as far as the net torque associated with the electrostatic disturbance is neutralized.

In some embodiments, when the balance stoppers 520 are realized directly using the sensor substrate 104, the sensor substrate 104 is biased at a specific balance voltage $V_{BL}$, and applies electrostatic force and torque on the proof mass 102. Such electrostatic force and torque compensates the corresponding force and torque generated by the shock stoppers 320 and the cap substrate 310. This embodiment spares the need for an additional layer of conducting film that is used as the balance stoppers 520.

In some embodiments, the locations and dimensions of sensor electrodes 110A and 110B have to be adjusted, such that the balance stopper 520 may be placed at a desirable location to effectively cancel out the electrostatic torque imposed by the corresponding shock stopper 320. In some other embodiments, the sensor electrodes 110A and 110B are determined to obtain a desirable sensitivity, and placement of the shock and balance stoppers 350 have to accommodate such arrangement. However, locations between each balance stopper 520 and its corresponding shock stopper 320 are always linked in order for separate torque neutralization.

One of those skilled in the art realizes that the number and locations of the balance stoppers 520 are determined and adjusted for the purposes of neutralizing the total electrostatic impact induced by the shock stoppers 320. More than one shock stopper 320 may be applied on each proof mass plane. On one hand, electrostatic force and torque caused by each shock stopper 320 may be compensated by the force and torque generated by one or more than one balance stopper 520. On the other hand, the force and torque generated by each balance stopper 520 may be applied to counteract the electrostatic force and torque caused by more than one shock stopper 320. Therefore, the number and locations of the balance stoppers are flexible as long as the total electrostatic force and torque on the proof mass may be neutralized.

Figure 6:
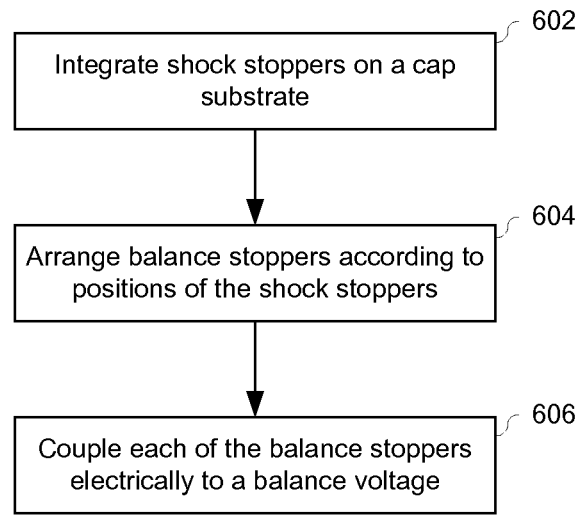
FIG. 6 illustrates an exemplary flow diagram of a method of protecting a MEMS device from mechanical shock and electrostatic disturbance according to various embodiments in the invention.

FIG. 6 illustrates an exemplary flow diagram 600 of a method of protecting a MEMS device from mechanical shock and electrostatic disturbance according to various embodiments in the invention. At step 602, shock stoppers are integrated on a cap substrate that is used in a MEMS package. The shock stoppers are located above a proof mass in the packaged MEMS device, so that at the time of a mechanical shock, the proof mass hit the shock stoppers rather than contacting a large area of the cap substrate. Locations of the shock stoppers are selected to effectively dampen the impact of the mechanical shock on the proof mass. At step 604, balance stoppers are arranged underneath the proof mass according to the positions of the shock stoppers. At step 606, each of the balance stoppers is electrically coupled to a balance voltage. Electrostatic torque imposed by each shock stopper is separately balanced by at least one corresponding balance stopper, and as a result, net torque corresponding to each pair of shock and balance stoppers is zero.

One of those skilled in the art knows that an out-of-plane accelerometer is used as an example of a MEMS device based on a moveable proof mass. This MEMS device may adopt a distinct structure and dimension to sense other parameters besides acceleration.

One of those skilled in the art will also realize that both shock and balance stoppers are z-axis out-of-plane stoppers, but used for different anti-shock and anti-electrostatics purposes. Shock stoppers are incorporated into a package of such MEMS device to protect it from mechanical shock. Balance stoppers are arranged according to the positions of the shock stoppers and biased under desirable balance voltages, such that electrostatic disturbance caused by each shock stopper is separately balanced by the torque generated by the corresponding balance stopper. Under the balance of the force and torque, the proof mass demonstrates no offset in its displacement when no acceleration is applied, and device performance, such as sensitivity of the device, is preserved.

While the invention is susceptible to various modifications and alternative forms, specific examples thereof have been shown in the drawings and are herein described in detail. It should be understood, however, that the invention is not to be limited to the particular forms disclosed, but to the contrary, the invention is to cover all modifications, equivalents, and alternatives falling within the scope of the appended claims.

We claim:

1. A microelectromechanical structure comprising:
 a sensor substrate;
 a proof mass suspended above the sensor substrate via at least one elastic element, the proof mass displacing and titling in response to acceleration of the structure;
 a cap substrate coupled to the sensor substrate, the cap substrate being bonded to the sensor substrate to form a cavity that encloses the proof mass, the cap substrate further comprising a plurality of shock stoppers that are arranged above the proof mass to push back the proof mass at specific locations upon a shock load; and
 a plurality of balance stoppers coupled underneath the proof mass, each of the plurality of balance stoppers being arranged according to a position of one of the plurality of shock stoppers and electrically driven by a balance voltage, each of the plurality of balance stoppers generating first electrostatic force and torque on the proof mass to balance second force and torque generated by a corresponding shock stopper.

2. The microelectromechanical structure according to claim 1, further comprising a sensor electrode that is arranged on the sensor substrate, the sensor electrode being coupled to an electrode on the proof mass to form a capacitor, a capacitance variation of the capacitor indicating a magnitude of an acceleration rate.

3. The microelectromechanical structure according to claim 2, wherein the sensor substrate further integrates a readout circuit that is coupled to process the capacitance variation.

4. The microelectromechanical structure according to claim 2, wherein the sensor electrode and the plurality of balance stoppers are made from a same layer of conducting film.

5. The microelectromechanical structure according to claim 2, wherein the plurality of balance stoppers is of the same material as the sensor substrate.

6. The microelectromechanical structure according to claim 1, wherein the structure is applied to detect out-of-plane acceleration that is perpendicular to a plane of the proof mass.

7. The microelectromechanical structure according to claim 1, wherein the cap substrate further comprises an edge, the cap and sensor substrates being bonded at the edge.

8. The microelectromechanical structure according to claim 7, wherein the edge and the plurality of shock stoppers have different heights.

9. The microelectromechanical structure according to claim 7, wherein the edge and the plurality of shock stoppers are formed by one method selected from recessing the cap substrate and assembling extrinsic edge and shock stopper parts on the cap substrate.

10. The microelectromechanical structure according to claim 1, wherein the sensor and cap substrates are bonded by a process selected from a metal-to-metal bonding process and a silicon-to-metal bonding process.

11. A method of protecting a microelectromechanical structure from mechanical shock and electrostatic disturbance, comprising the steps of:
integrating a plurality of shock stoppers on a cap substrate, the cap substrate being bonded to a sensor substrate to form a cavity that encloses a proof mass, the proof mass being suspended above the sensor substrate via at least one elastic element such that the proof mass displaces and tilts in response to acceleration of the structure, the plurality of shock stoppers being arranged above the proof mass to push back the proof mass at specific locations upon a shock load;
arranging a plurality of balance stoppers underneath the proof mass according to a position of one of the plurality of shock stoppers; and
coupling each of the plurality of balance stoppers electrically to a balance voltage, each of the plurality of balance stoppers generating first electrostatic force and torque on the proof mass to balance second force and torque generated by a corresponding shock stopper.

12. The method according to claim 11, wherein a sensor electrode is arranged on the sensor substrate, the sensor electrode being coupled to an electrode on the proof mass to form a capacitor, a capacitance variation of the capacitor indicating a magnitude of acceleration.

13. The method according to claim 12, wherein the sensor substrate further integrates a readout circuit that is coupled to process the capacitance variation.

14. The method according to claim 12, wherein the sensor electrode and the plurality of balance stoppers are made from a same layer of conducting film.

15. The method according to claim 11, wherein the plurality of balance stoppers is made directly on the sensor substrate.

16. The method according to claim 11, wherein the structure is applied to detect out-of-plane acceleration that is perpendicular to a plane of the proof mass.

17. The method according to claim 11, wherein the cap substrate further comprises an edge, the cap and sensor substrates being bonded at the edge.

18. The method according to claim 17, wherein the edge has a distinct height from that of the plurality of shock stoppers.

19. The method according to claim 17, wherein the edge and the plurality of shock stoppers are formed by one method selected from recessing the cap substrate and assembling extrinsic edge and shock stopper parts on the cap substrate.

20. The method according to claim 11, wherein the sensor and cap substrates are bonded by a process selected from a metal-to-metal bonding process and a silicon-to-metal bonding process, and the cap substrate is polarized at ground or at a specific voltage.

* * * * *